(12) United States Patent
Visokay et al.

(10) Patent No.: US 8,183,137 B2
(45) Date of Patent: May 22, 2012

(54) USE OF DOPANTS TO PROVIDE LOW DEFECT GATE FULL SILICIDATION

(75) Inventors: Mark Visokay, Richardson, TX (US); Jorge Adrian Kittl, Waterloo (BE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/752,424

(22) Filed: May 23, 2007

(65) Prior Publication Data
US 2008/0290427 A1 Nov. 27, 2008

(51) Int. Cl.
*H01L 21/22* (2006.01)
*H01L 21/38* (2006.01)
(52) U.S. Cl. ........ 438/558; 438/199; 438/369; 438/682; 257/E21.151; 257/E21.296
(58) Field of Classification Search .......... 438/199, 438/682, 683, 685, 369, 372, 373, 542, 55, 438/649, 651, 655, 664, 755, FOR. 320, FOR. 360; 257/E21.151, E21.199, E21.202, E21.296
See application file for complete search history.

(56) References Cited

U.S. PATENT DOCUMENTS

| | | | | |
|---|---|---|---|---|
| 6,100,120 | A * | 8/2000 | Yu | 438/151 |
| 6,204,132 | B1 * | 3/2001 | Kittl et al. | 438/299 |
| 6,599,831 | B1 * | 7/2003 | Maszara et al. | 438/649 |
| 6,727,133 | B1 * | 4/2004 | Baldwin | 438/210 |
| 2004/0135204 | A1 * | 7/2004 | Wang et al. | 257/348 |
| 2005/0130366 | A1 * | 6/2005 | Lu | 438/233 |
| 2005/0245016 | A1 * | 11/2005 | Pan et al. | 438/199 |
| 2005/0269635 | A1 * | 12/2005 | Bojarczuk et al. | 257/338 |
| 2006/0008961 | A1 * | 1/2006 | Lee et al. | 438/197 |
| 2006/0131652 | A1 * | 6/2006 | Li | 257/350 |

OTHER PUBLICATIONS

Saitoh, Motofumi, et al.; "Strain Controlled CMOSFET with Phase Controlled Full-silicide (PC-FUSI)/HfSion Gate Stack Structure for 45nm-node LSTP Devices"; 2006 Symposium on VLSI Technology, pp. 162-163.
Lavoie, C.; "Effects of additive elements on the phase formation and morphological stability of nickel monosilicide films"; Microelectronic Engineering 83, pp. 2041-2054 (2006). Available online at www.sciencedirect.com.

* cited by examiner

*Primary Examiner* — Julio J Maldonado
*Assistant Examiner* — Quovaunda V Jefferson
(74) *Attorney, Agent, or Firm* — Jacqueline J. Garner; Wade J. Brady, III; Frederick J. Telecky, Jr.

(57) ABSTRACT

The disclosure provides a semiconductor device and method of manufacture therefore. The method for manufacturing the semiconductor device, in one embodiment, includes forming a layer of gate electrode material over a layer of gate dielectric material, wherein the layer of gate dielectric material is positioned over a substrate (210). This method further includes patterning the layer of gate electrode material and the layer of gate dielectric material into an NMOS gate structure (230), wherein the NMOS gate structure (230) includes an NMOS gate dielectric (240) and an NMOS gate electrode (250). This method further includes forming n-type source/drain regions (710) within the substrate (210) proximate the NMOS gate structure (230), and siliciding the NMOS gate electrode (250) to form a silicided gate electrode (1110, 1210). This method additionally includes placing a p-type dopant within the layer of gate electrode material or the NMOS gate electrode (250) prior to or concurrently with siliciding.

7 Claims, 7 Drawing Sheets

USE OF DOPANTS TO PROVIDE LOW DEFECT GATE FULL SILICIDATION

TECHNICAL FIELD OF THE INVENTION

The invention is directed, in general, to the silicidation of gates and, more specifically, to the use of dopants to provide low defect gate full silicidation.

BACKGROUND OF THE INVENTION

Metal gate electrodes are currently being investigated to replace polysilicon gate electrodes in today's ever shrinking and changing transistor devices. One of the principal reasons the industry is investigating replacing the polysilicon gate electrodes with metal gate electrodes is in order to solve problems of poly-depletion. Traditionally, a polysilicon gate electrode with an overlying silicide was used for the gate electrodes in metal oxide semiconductor (MOS) devices. However, as device feature size continues to shrink, poly depletion becomes a serious issue when using polysilicon gate electrodes.

Accordingly, metal gates have been proposed. However, in order to optimize the performance of CMOS devices, the metal gates need dual tunable work functions. For instance, the metal gates need tunable work functions for NMOS and PMOS devices similar to present polysilicon gate technology, requiring the work functions of metal gates to range from 4.1~4.4 eV for NMOS and 4.8~5.1 eV for PMOS (see, B. Cheng, B. Maiti, S. Samayedam, J. Grant, B. Taylor, P. Tobin, J. Mogab, IEEE Intl. SOI Conf. Proc., pp. 91-92, 2001).

Recently, silicided metal gates have been investigated based on the extension of existing self-aligned silicide (SALICIDE) technology. In this approach, polysilicon is deposited over the gate dielectric. A metal is deposited over the polysilicon and reacted to completely consume the polysilicon resulting in a fully silicided metal gate, rather than a deposited metal gate. The silicided metal gate provides a metal gate with the least perturbation to the conventional process, and avoids contamination issues.

Nevertheless, one problem associated with this technology is the ability (or inability) to completely react all of the polysilicon in the gate electrode with the metal. For example, if the anneal used to form the silicide is too mild the gate electrodes will not fully react; however, if the anneal used to form the silicide is too aggressive the metal can penetrate into the channel, which is catastrophic to the device.

Accordingly, what is needed is a method for manufacturing silicided metal gate structures that does not experience these and other drawbacks of the prior art methods.

SUMMARY OF THE INVENTION

To address the above-discussed deficiencies of the prior art, the disclosure provides a semiconductor device and method of manufacture therefore. The method for manufacturing the semiconductor device, in one embodiment, includes forming a layer of gate electrode material over a layer of gate dielectric material, wherein the layer of gate dielectric material is positioned over a substrate. This method further includes patterning the layer of gate electrode material and the layer of gate dielectric material into an NMOS gate structure, wherein the NMOS gate structure includes an NMOS gate dielectric and an NMOS gate electrode. This method further includes forming n-type source/drain regions within the substrate proximate the NMOS gate structure, and siliciding the NMOS gate electrode to form a silicided gate electrode. This method additionally includes placing a p-type dopant within the layer of gate electrode material or the NMOS gate electrode prior to or concurrently with siliciding.

In an alternative embodiment, the method for manufacturing the semiconductor device includes forming a layer of gate electrode material over a layer of high-k gate dielectric material, wherein the layer of high-k gate dielectric material is positioned over a substrate. This method further includes patterning the layer of gate electrode material and the layer of high-k gate dielectric material into a gate structure, wherein the gate structure includes a gate dielectric and a gate electrode. This method further includes forming source/drain regions within the substrate proximate the gate structure, and siliciding the gate electrode to form a silicided gate electrode. This method additionally includes placing a p-type dopant within the layer of gate electrode material or the gate electrode prior to or concurrently with siliciding.

In yet another embodiment, the method for manufacturing the semiconductor device includes selecting a dopant based upon an ability to reduce a formation of high-stress transient silicide phases within a gate electrode material. This method further includes siliciding a layer of the gate electrode material in a presence of the dopant, the dopant reducing a silicidation transient stress.

Also provided is a semiconductor device. The semiconductor device, in this embodiment, includes an NMOS gate structure located over a substrate, wherein the NMOS gate structure includes an NMOS gate dielectric and a fully silicided NMOS gate electrode including a p-type dopant. The semiconductor device, in this embodiment, may further include n-type source/drain regions located within the substrate proximate the NMOS gate structure.

In another embodiment, the semiconductor device includes a gate structure located over a substrate, wherein the gate structure includes a high-k gate dielectric and a fully silicided gate electrode having a p-type dopant. This semiconductor device may further include source/drain regions located within the substrate proximate the gate structure.

BRIEF DESCRIPTION OF THE DRAWINGS

For a more complete understanding of the invention, reference is now made to the following descriptions taken in conjunction with the accompanying drawings, in which.

DETAILED DESCRIPTION

The present disclosure is based, at least in part, on the acknowledgement that certain transient phases that may exist during a typical silicidation process are particularly problematic. The phrase "transient phases", as used throughout this disclosure, means material phases of the metal silicide that may exist during the process of siliciding a polysilicon material but that do not exist after the process is complete. More specifically, the present disclosure acknowledges that certain ones of these transient phases result in transient stress in the material being silicided. The phrase "transient stress", as used throughout this disclosure, means stress that exists during the process of siliciding a polysilicon material but that does not exist after the process is complete. Moreover, the present disclosure acknowledges that the transient stresses may, in certain instances, be the cause of metal punchthrough into the channel region of semiconductor devices, and thus ultimate device failure.

Based upon these acknowledgements, as well as substantial experimentation, the present disclosure recognizes that the selection and inclusion of certain dopants into the gate electrode, for example before or during the silicidation process, reduces or eliminates the formation of the transient phases that tend to cause unwanted transient stress. For example, the present disclosure recognizes that the inclusion of the p-type dopant boron, among others, into the gate electrode material may reduce or eliminate the formation of the transient phase $Ni_{31}Si_{12}$ (e.g., also referred to as $Ni_5Si_2$). Other dopants, however, might be used to reduce or prevent the formation of the $Ni_{31}Si_{12}$, as well as other undesirable transient phases.

The present disclosure further recognizes that a p-type dopant may be included within a fully silicided gate electrode of an n-type metal oxide semiconductor (NMOS) device to reduce the transient stress. Previous uses of dopants within the fully silicided gate electrodes of NMOS devices focused on n-type dopants. Accordingly, it is counterintuitive to place a p-type dopant within a gate electrode of a NMOS device, particularly to reduce the transient stress.

The present disclosure additionally recognizes that a p-type dopant may be included within a fully silicided gate electrode of a p-type metal oxide semiconductor (PMOS) device, particularly when the PMOS device is using a high-k gate dielectric. Heretofore, it was believed that the traditional benefits of using a p-type dopant (e.g., the ability to tune the work function of the gate electrode) were lost when the p-type dopant was combined with a fully silicided gate electrode and high-k gate dielectric. For this reason, it is counterintuitive to have a p-type doped fully silicided gate electrode located over a high-k dielectric, as is disclosed herein.

Figure 1:
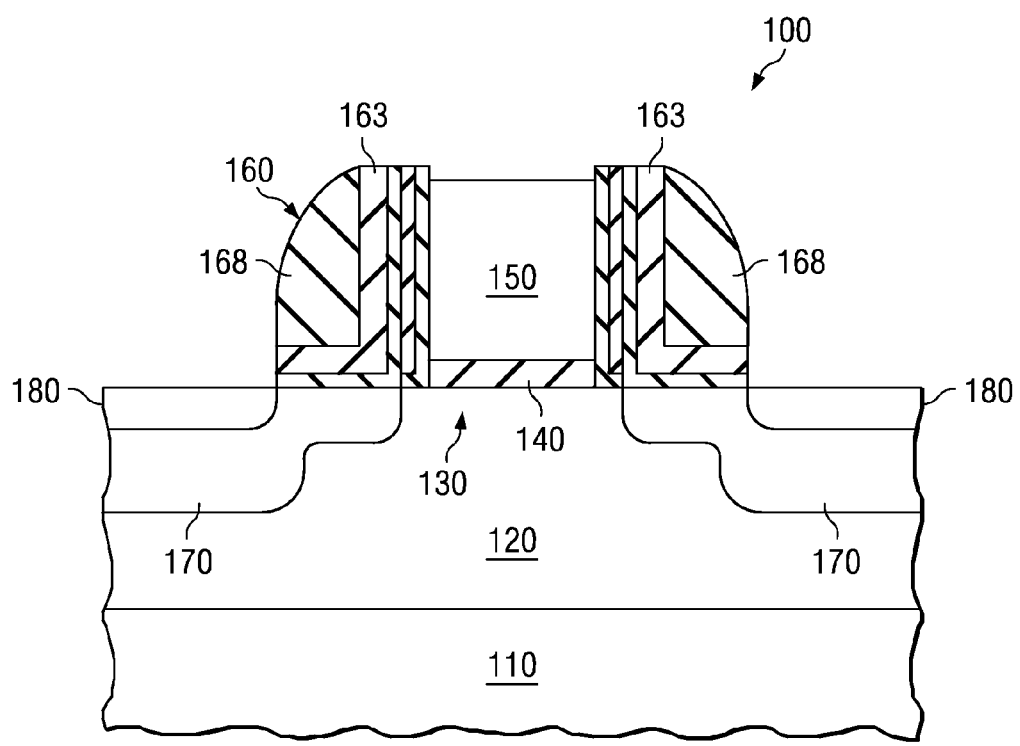
FIG. 1 illustrates a semiconductor device constructed according to one embodiment of the disclosure.

FIG. 1 illustrates a semiconductor device 100 constructed according to one embodiment of the disclosure. The semiconductor device 100, depending on the embodiment, may be configured as either a PMOS device or an NMOS device. Both configurations will be discussed with reference to FIG. 1.

The semiconductor device 100 includes a substrate 110. Located within the substrate 110 in the embodiment of FIG. 1 is a well region 120. Depending on whether the device 100 is a PMOS device or NMOS device, the well region 120 might be doped with an n-type dopant or p-type dopant, respectively. Moreover, the well region 120 may or may not exist, for example based upon the specific design of the device 100. From this point forward, those features that would be used within an NMOS device may be referred to as an NMOS feature and those features that would be used within a PMOS device may be referred to as a PMOS feature.

Located over the substrate 110 and well region 120 is a gate structure 130. The gate structure 130 includes a gate dielectric 140 and a gate electrode 150. The gate dielectric 140 may comprise many different materials and remain within the purview of the disclosure. For example, in those embodiments wherein the device 100 is a NMOS device, the gate dielectric 140 may comprise silicon dioxide, silicon oxynitride, a high-k dielectric (e.g., a dielectric material having a dielectric constant greater than silicon dioxide), etc. In those embodiments wherein the device 100 is a PMOS device, the gate dielectric 140 may comprise a high-k dielectric, among others.

The gate electrode 150, as shown, is fully silicided. The term "fully silicided", as used throughout this disclosure, means that all of the silicon within the gate electrode 150 has reacted to form a metal silicide. The gate electrode 150, when constructed in accordance with the disclosure, may comprise a number of different materials. For instance, in the illustrative embodiment shown in FIG. 1 the gate electrode 150 includes nickel, thus forming a nickel silicide. However, it is envisioned that the gate electrode 150 could also include platinum, titanium, tantalum, molybdenum, tungsten, cobalt, etc. while staying within the scope of the present disclosure.

In the given embodiment of FIG. 1, the gate electrode 150 includes a dopant selected specifically to reduce transient stress that may form during the silicidation process. For example, in one embodiment the dopant (e.g., a transient stress dopant) selected is a p-type dopant such as boron. This transient stress dopant may be selected to prevent the formation of $Ni_{31}Si_{12}$ as a transient phase during silicidation. The transient stress dopant, however, is not selected based upon only its ability to tune the work function of the gate electrode 150.

The gate structure 130 further contains gate sidewall spacers 160 on the sides of the gate electrode 150 and gate dielectric 140. The gate sidewall spacers 160 in the embodiment of FIG. 1 each include a number of different layers. For instance the gate sidewall spacers 160, among other layers, each include L-shaped nitride spacers 163 and sidewall oxides 168. The other layers, among other materials, could include a collection of oxides and nitrides. Nevertheless, the gate sidewall spacers 160 may comprise many different types and numbers of layers while staying consistent with the principles taught herein.

The semiconductor device 100 illustrated in FIG. 1 additionally includes source/drain regions 170 located within the substrate 110 and proximate the gate structure 130. The source/drain regions 170 may include both extension implants and source/drain implants. The source/drain regions 170, depending on whether the device 100 is a PMOS device or NMOS device, may comprise a p-type dopant or n-type dopant, respectively.

Located within the source/drain regions 170 are silicided source/drain regions 180. In one embodiment, the silicided source/drain regions 180 act as source/drain contact regions as well as blocking layers (e.g., to protect the source/drain regions 170 from the silicidation material used to silicide the gate electrode 150).

Figure 2:
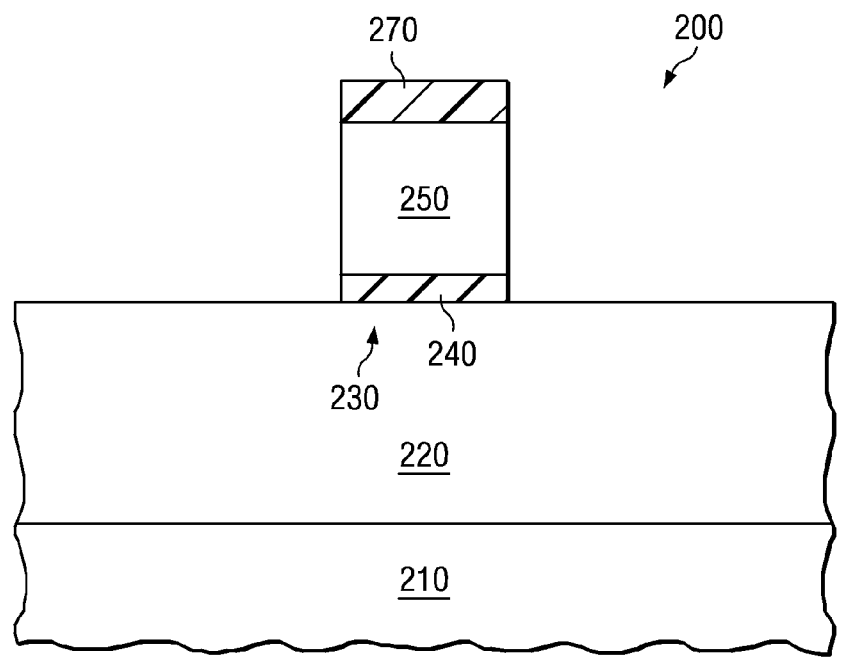
FIGS. 2-12 illustrate detailed steps of one example embodiment for manufacturing a semiconductor device in accordance with this disclosure.

FIGS. 2-12 illustrate detailed steps of one example embodiment for manufacturing a semiconductor device in accordance with this disclosure. FIG. 2 illustrates a semiconductor device 200 at an initial stage of manufacture. The device 200 includes a substrate 210. The substrate 210 may, in one embodiment, be any layer located in the device 200, including a wafer itself or a layer located above the wafer (e.g., epitaxial layer). In the embodiment illustrated in FIG. 2, the substrate 210 is a p-type substrate; however, one skilled in the art understands that the substrate 210 could be an n-type substrate without departing from the disclosure. In such an embodiment, certain ones of the dopant types described throughout the remainder of this document might be reversed. For clarity, no further reference to this opposite scheme will be discussed.

Located within the substrate 210 in the embodiment shown in FIG. 2 is a well region 220. The dopant type for the well region 220 would typically depend on whether the device 200 is a PMOS device or NMOS device. In those embodiments wherein the device 200 is a PMOS device, the well region 220 would include an n-type dopant. In those embodiments wherein the device 200 is an NMOS device, the well region 220 would include a p-type dopant. Those skilled in the art understand that in certain circumstances where the p-type substrate 210 dopant concentration is high enough, and the device 200 comprises an NMOS device, the well region 220 may be excluded. In those embodiments wherein the well region 220 exists, it would likely be ion implantated using a dopant dose ranging from about 1E13 atoms/cm$^2$ to about 1E14 atoms/cm$^2$ and at an energy ranging from about 100 keV to about 500 keV. This results in the well region 220 having a peak dopant concentration ranging from about 5E17 atoms/cm$^3$ to about 1E19 atoms/cm$^3$.

Located over the substrate 210 in the embodiment of FIG. 2 is a gate structure 230. The gate structure 230 includes a gate dielectric 240 and a gate electrode 250. The gate dielectric 240 may comprise a number of different materials and stay within the scope of the present invention. For example, the gate dielectric 240 may comprise silicon dioxide in one embodiment. In another embodiment, the gate dielectric 240 can be any one of a number of high-K dielectric materials and be within the scope of this disclosure. Such materials include a variety of hafnium and zirconium silicates and their various oxides. For example, in one embodiment the high-k dielectric material might comprise HfSiO, however in other embodiments the high-k dielectric material might comprise HfO$_2$, HfSiON, HfAlO or HfLaO.

The gate dielectric 240 may additionally be formed to varying thicknesses. For example, in the embodiment wherein the gate dielectric 240 comprises silicon dioxide, it might have a thickness ranging from about 0.5 nm to about 5 nm, and more specifically a thickness ranging from about 1 nm to about 3 nm. In the embodiment wherein the gate dielectric 240 comprises a high-k material, for example a hafnium based material, it might have a thickness ranging from about 1.5 nm to about 5 nm. Other thicknesses could nonetheless also be used.

Any one of a plurality of manufacturing techniques could be used to form the gate dielectric 240. For example, the gate dielectric 240 may be either grown or deposited. Additionally, the growth or deposition steps may require a significant number of different temperatures, pressures, gasses, flow rates, etc. Those skilled in the art understand the skill that may be required to tailor such process conditions.

The gate electrode 250 should comprise a material capable of being silicided. Accordingly, in one embodiment the gate electrode 250 comprises standard polysilicon. In an alternative embodiment, however, the gate electrode 250, or at least a portion thereof, comprises amorphous polysilicon. The amorphous polysilicon embodiment may be particularly useful when a substantially planar upper surface of the gate electrode 250 is desired. Nevertheless, this amorphous polysilicon embodiment will be discussed no further.

The deposition conditions for the gate electrode 250 may vary. However, if the gate electrode 250 were to comprise standard polysilicon, such as the instance in FIG. 2, the gate electrode 250 could be deposited using a pressure ranging from about 100 torr to about 300 torr and a temperature ranging from about 620° C. to about 700° C. Additionally, a SiH$_4$ or Si$_2$H$_6$ gas flow ranging from about 50 sccm to about 150 sccm might be used. Other deposition conditions different from those disclosed could nonetheless also be used. The gate electrode 250 desirably has a thickness ranging from about 50 nm to about 150 nm, among others.

The device 200 of FIG. 2 further includes a protective layer 270 located over the gate electrode 250. In one embodiment, the protective layer 270 is located directly on the gate electrode 250; however, other embodiments exist wherein one or more layers interpose the two. The protective layer 270, which may comprise silicon nitride among other materials, may have a thickness ranging from about 5 nm to about 50 nm. Nevertheless, the protective layer 270 should have a thickness sufficient to adequately protect the gate electrode 250. The protective layer 270, in one embodiment, functions as a hardmask layer. In this embodiment, the protective layer 270 and a lithography process (e.g., including patterned photoresist) could be used to pattern the gate dielectric 240 and gate electrode 250.

Prior to the patterning of the gate structure 230, for example using the protective layer 270, the device 200 would typically include a conformal layer of gate dielectric material having a conformal layer of gate electrode material located thereover. In one embodiment, the conformal layer of gate electrode material would be implanted with a transient stress dopant prior to the patterning of the gate structure 230. Accordingly, in this embodiment the conformal layer of gate electrode material would be implanted with the dopant prior to the depositing and patterning of the protective layer 270. Nevertheless, other embodiments exist wherein the patterned gate electrode 250 itself, is implanted with the dopant, or even wherein the metal used to silicide the gate electrode 250 includes the dopant. These alternative embodiments will be discussed further below.

Figure 3:
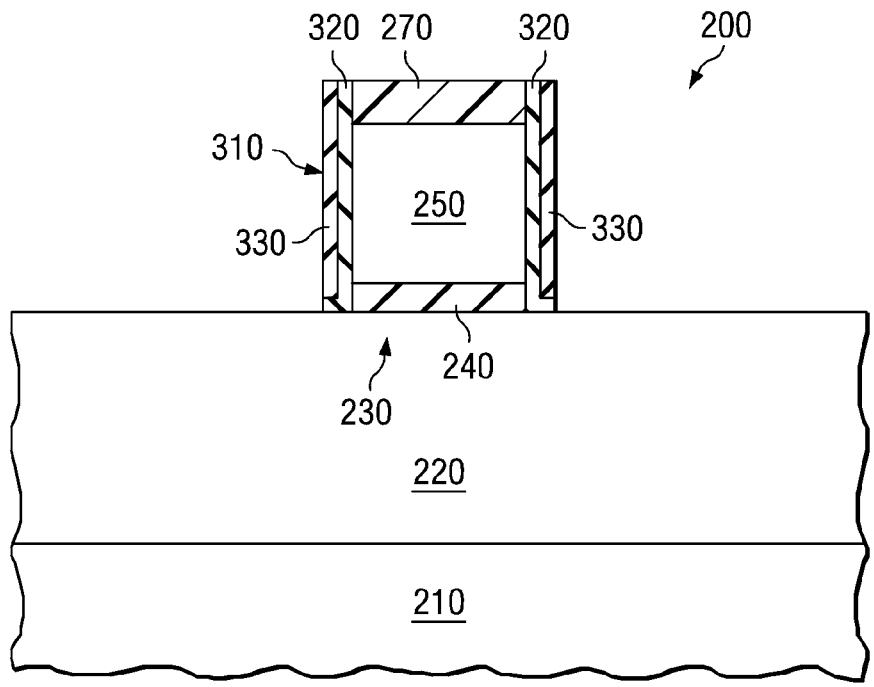

FIG. 3 illustrates the device 200 of FIG. 2 after forming portions of gate sidewall spacers 310. The portions of the gate sidewall spacers 310 shown in FIG. 3 include an oxide layer 320 and an offset nitride spacer 330. Nevertheless, other layers may be used for the gate sidewall spacers 310. In the embodiment of FIG. 3, the oxide layer 320 and offset nitride spacer 330 were formed using standard processes. However, other non-standard processes could be used.

Figure 4:
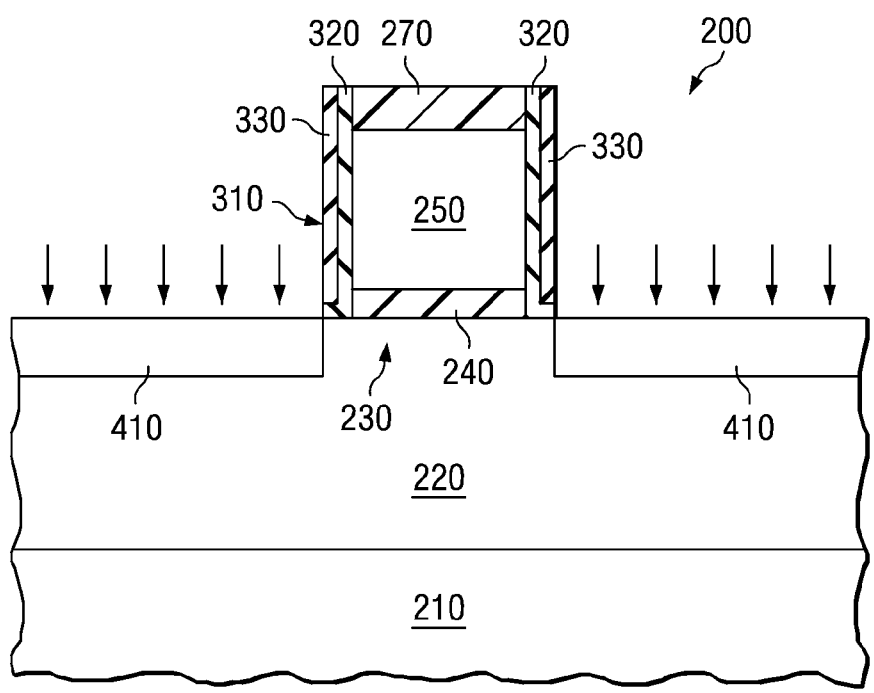

FIG. 4 illustrates the device 200 of FIG. 3 after the formation of extension implants 410 within the substrate 210. The extension implants 410 may be conventionally formed and generally have a peak dopant concentration ranging from about 1E19 atoms/cm$^3$ to about 2E20 atoms/cm$^3$. As is standard in the industry, the extension implants 410 have a dopant type opposite to that of the well region 220 they are located within. Thus, in the embodiment wherein the device 200 is a PMOS device the extension implants 410 might comprise a p-type dopant, and in the embodiment wherein the device 200 is an NMOS device the extension implants 410 might comprise an n-type dopant.

Figure 5:
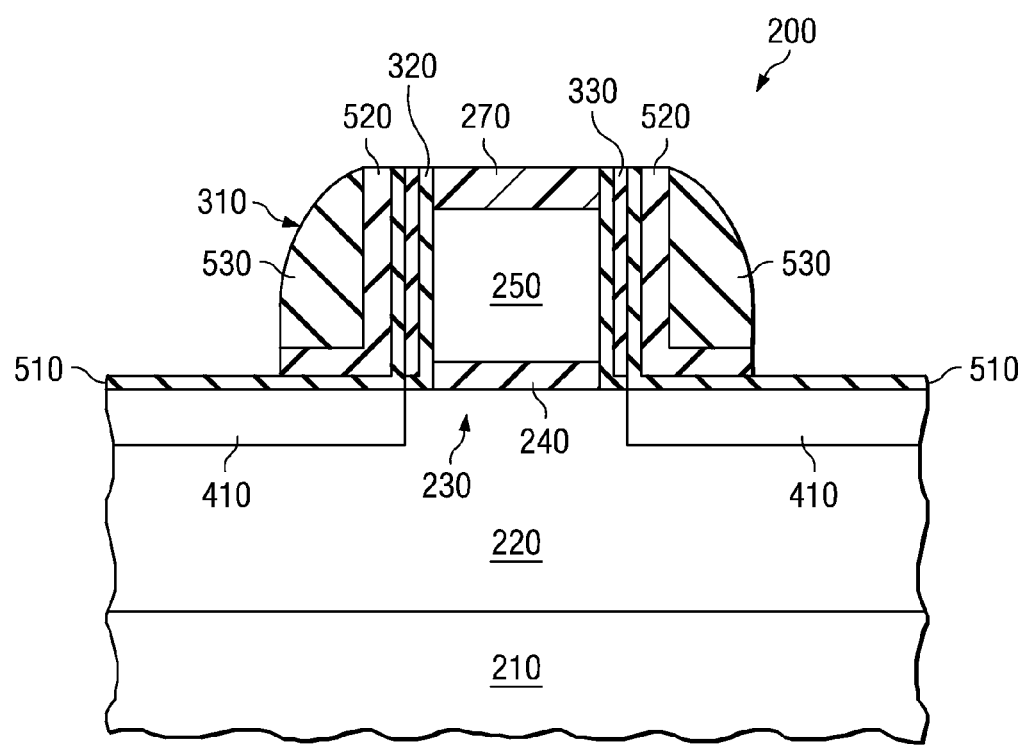

FIG. 5 illustrates the device 200 of FIG. 4 after forming remaining portions of the gate sidewall spacers 310. Particularly, a cap oxide 510, L-shaped nitride spacers 520 and sidewall oxides 530 complete the gate sidewall spacers 310. FIG. 5 indicates that an L-shaped scheme is used to complete the gate sidewall spacers. However, other embodiments exist wherein a single bulk spacer, for example comprising an oxide, completes the gate sidewall spacers. The remaining portions of the gate sidewall spacers 310 may be manufactured using, among others, conventional processes.

Figure 6:
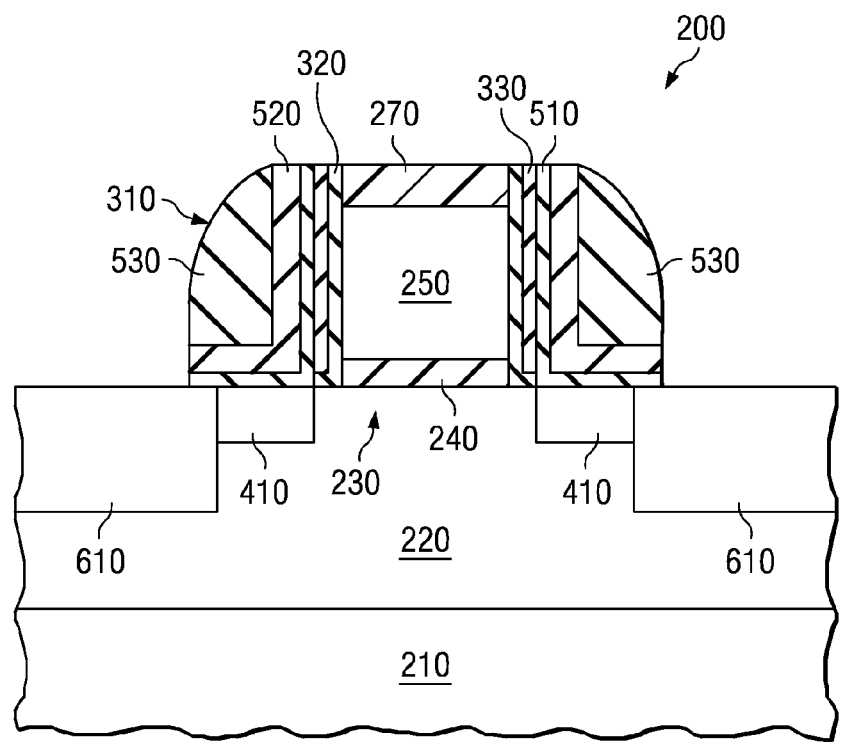

FIG. 6 illustrates the device 200 of FIG. 5 after the formation of source/drain implants 610 within the substrate 210. The formation of the source/drain implants 610 may, in one embodiment, be conventional. Generally the source/drain implants 610 have a peak dopant concentration ranging from about 1E18 atoms/cm$^3$ to about 1E21 atoms/cm$^3$. The source/drain implants 610 typically have a dopant type opposite to that of the well region 220 they are located within. Thus, in the embodiment wherein the device 200 is a PMOS device the source/drain implants 610 might comprise a p-type dopant, and in the embodiment wherein the device 200 is an NMOS device the source/drain implants 610 might comprise an n-type dopant.

Figure 7:
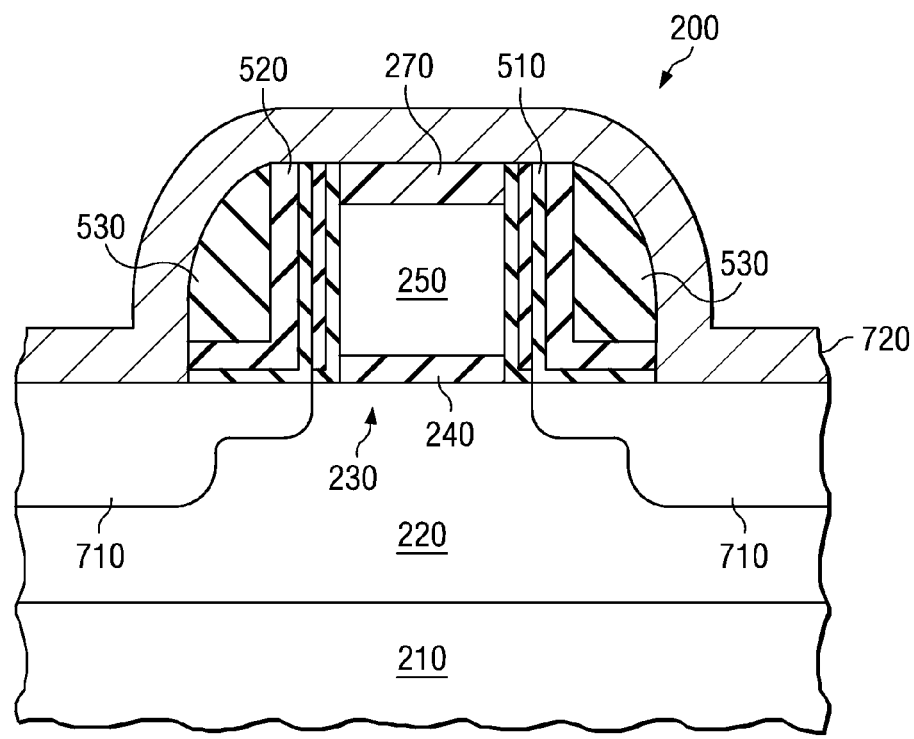

FIG. 7 illustrates the device 200 of FIG. 6 after subjecting the device 200 to a source/drain anneal, thereby activating source/drain regions 710. It is believed that a source/drain anneal conducted at a temperature ranging from about 1000° C. to about 1350° C. and a time period ranging from about 1 millisecond to about 5 seconds would be sufficient. It should be noted that other temperatures, times, and processes could be used to activate the source/drain regions 710.

Additionally illustrated in FIG. 7 is the formation of a metal 720 over the exposed portions of the source/drain regions 710 as well as over the gate structure 230. As shown, the metal 720 may cover the entire surface of the device 200. The metal 720 in the embodiment shown in FIG. 7 happens to be a thin cobalt layer, however, other materials that react with silicon to form a silicide could easily be used. For instance, it is known that the metal 720 may also comprise nickel, platinum, titanium, tantalum, molybdenum, tungsten, another similar metal, or any combination thereof while staying within the scope of the present disclosure.

The metal 720 may be formed using a number of different processes, and may be formed to a number of different thicknesses. In one embodiment, the metal 720 is deposited to a thickness ranging from about 3 nm to about 15 nm. Such thicknesses, however, might be used when the metal 720 comprises cobalt. Various other thicknesses could be used if the metal 720 were to comprise one of the different metals disclosed above.

Figure 8:
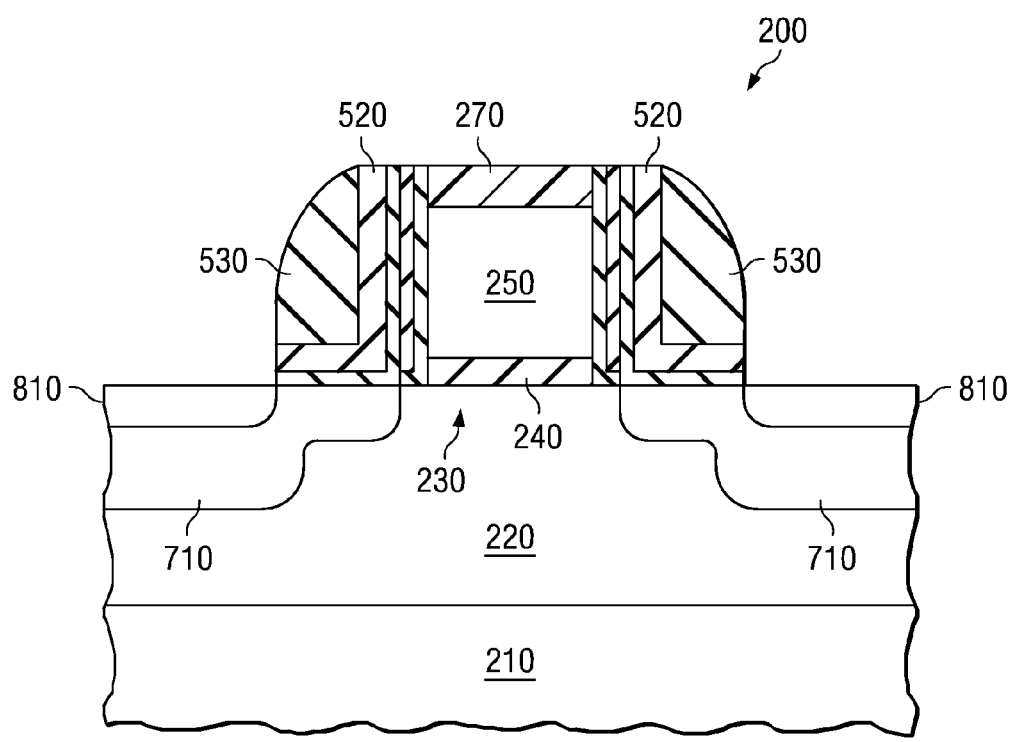

FIG. 8 illustrates the device 200 of FIG. 7 after subjecting it to a first rapid thermal anneal (RTA) and subsequent selective metal strip. This RTA attempts to cause the metal 720 to react with the silicon of the source/drain regions 710 to form silicided source/drain regions 810. In the instance where the metal 720 comprises cobalt, the first RTA causes the cobalt to react with the silicon to form a cobalt silicide.

The first RTA may be conducted using a variety of different temperatures and times. Nonetheless, it is believed that the first RTA, in one embodiment, should be conducted in a rapid thermal processing tool at a temperature ranging from about 350° C. to about 550° C. and a time period ranging from about 10 second to about 100 seconds to accomplish the silicidation, particularly when cobalt is used. The specific temperature and time period are typically based, however, on the ability to form the silicided source/drain regions 810 to a desired depth, as well as the silicide materials selected. A selective wet etch, using for example a mixture of sulfuric acid ($H_2SO_4$), hydrogen peroxide ($H_2O_2$) and water ($H_2O$), may then be used to remove un-reacted metal 720.

Additionally, another optional second RTA step may be used to form a low resistivity phase of the silicide. In the case of using a cobalt metal, the first RTA forms CoSi, while the optional second RTA forms $CoSi_2$, which has lower resistivity and is more stable. This optional second RTA step is typically performed using a temperature ranging from about 650° C. to about 800° C. for a time period ranging from about 5 to about 60 seconds.

Figure 9:
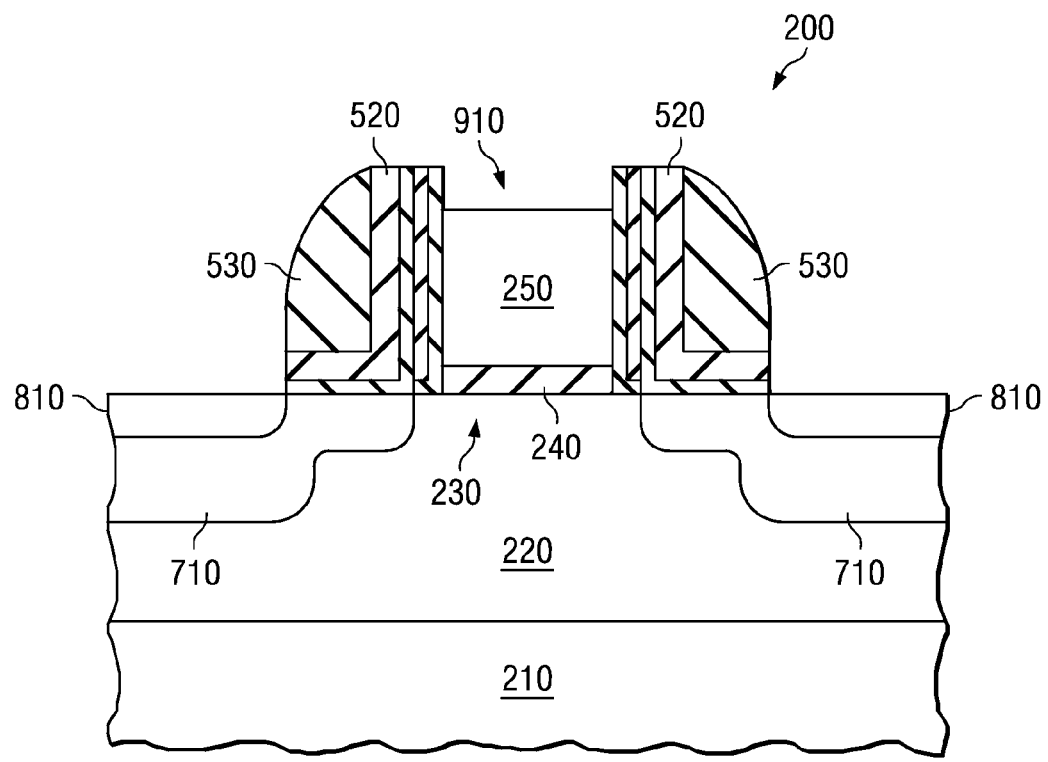

FIG. 9 illustrates the device 200 of FIG. 8 after removing the protective layer 270 from over the gate electrode 250 to form an opening 910. In one embodiment, the etchant used to remove the protective layer 270 is highly selective to the gate electrode 250. Accordingly, this etchant does not substantially affect the gate electrode 250. Those skilled in the art appreciate that the specific etch chosen for the protective layer 270 is highly dependent on the materials for each and the etch selectivities for each.

At this stage of manufacture, for example if the transient stress dopant was not previously included within the gate electrode 250, the dopant could be implanted within the gate electrode 250. In one embodiment, for example wherein the transient stress dopant is boron, it would likely be implanted using a boron dose ranging from about 1E15 atoms/$cm^2$ to about 8E15 atoms/$cm^2$ and at an energy ranging from about 1 keV to about 10 keV. This would typically result in the boron being located throughout the gate electrode 250, for example having a peak boron concentration ranging from about 1E19 atoms/$cm^3$ to about 5E20 atoms/$cm^3$. Other dopant types, implantation conditions, etc. could nonetheless also be used and remain within the purview of this disclosure. In such an embodiment, the processes would be tailored to the desires of the manufacturer, as well as tailored to reduce the aforementioned silicidation transient stress.

Those skilled in the art understand the steps that might be required to place the transient stress dopant within the gate electrode 250, while keeping it out of other regions of the device 200. In one embodiment, however, a conformal layer of nitride is deposited over the entire device 200. Thereafter, a thick layer of oxide material is deposited over the nitride material, including the gate structures. The conformal layer of nitride and the thick layer of oxide material may then be etched back over regions of the device 200 where the gate structure 230 is located. In this embodiment, the nitride and oxide would protect regions of the device 200 except the gate electrode 250. Other processes could also be used.

Figure 10:
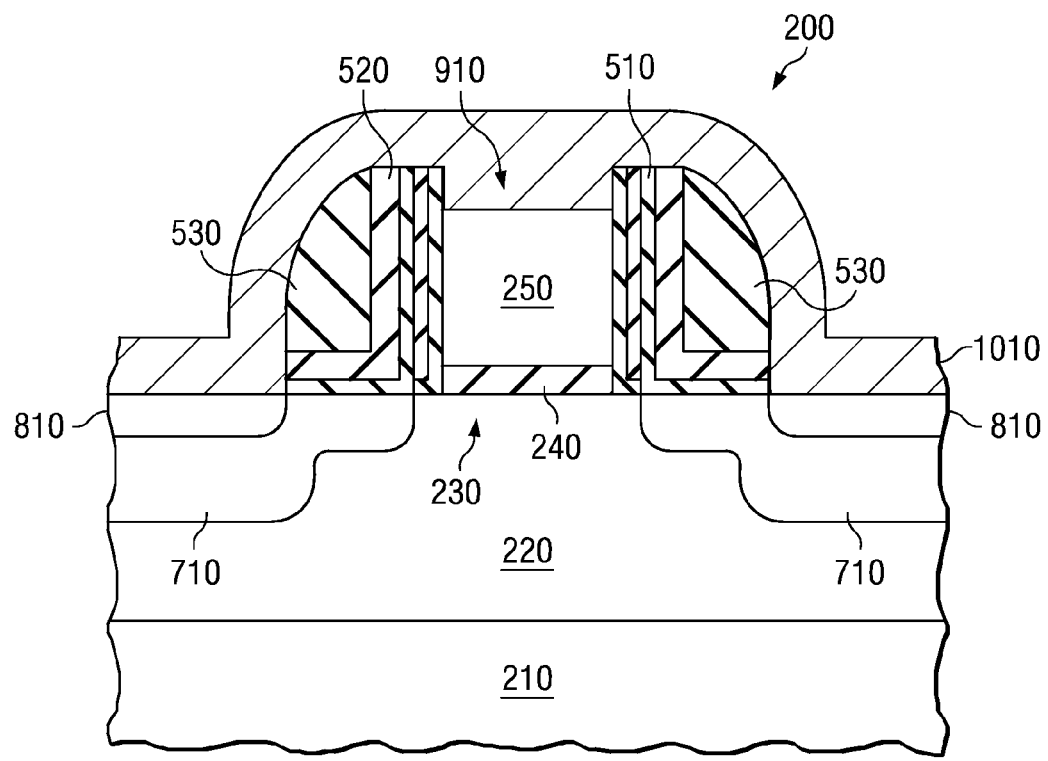

FIG. 10 illustrates the device 200 of FIG. 9 after depositing a second metal 1010 over the exposed portions of the gate electrode 250, as well as over the remainder of the semiconductor device 200. In this disclosed embodiment, the metal 1010 is designed to silicidize the gate electrode 250. For example, in the embodiment wherein the second metal 1010 is nickel, the nickel layer would be deposited to a thickness sufficient to silicide the gate electrode 250. As it takes approximately 1 nm of nickel to silicidize approximately 1.8 nm of polysilicon, the thickness of the metal 1010, in this embodiment, should be at least 56% of the thickness of the gate electrode 250. To be comfortable, however, it is suggested that the thickness of the metal 1010 should be at least 60% of the thickness of the gate electrode 250. Thus, where the thickness of the gate electrode 250 ranges from about 50 nm to about 150 nm, as described above, the thickness of the metal 1010 should range from approximately 30 nm to about 90 nm.

It should also be noted that the metal 1010 might comprise a number of different metals or combinations of metals while staying within the scope of the present disclosure. For example, the metal 1010 may comprise any metal known to react with polysilicon to form a metal silicide. In these embodiments, the thickness of the metal might be different from that disclosed above.

Again, in those embodiments wherein the transient stress dopant is not already located within the gate structure 250, the transient stress dopant may be implanted through the metal 1010 into the gate structure 250. This represents but one additional method for incorporating the transient stress dopant within the gate structure 250. In yet another embodiment, the chosen transient stress dopant may be included within the metal 1010 itself. In this alternative embodiment, the transient stress dopant would be incorporated from the metal 1010 into the gate structure 250 during a subsequent silicidation process.

Figure 11:
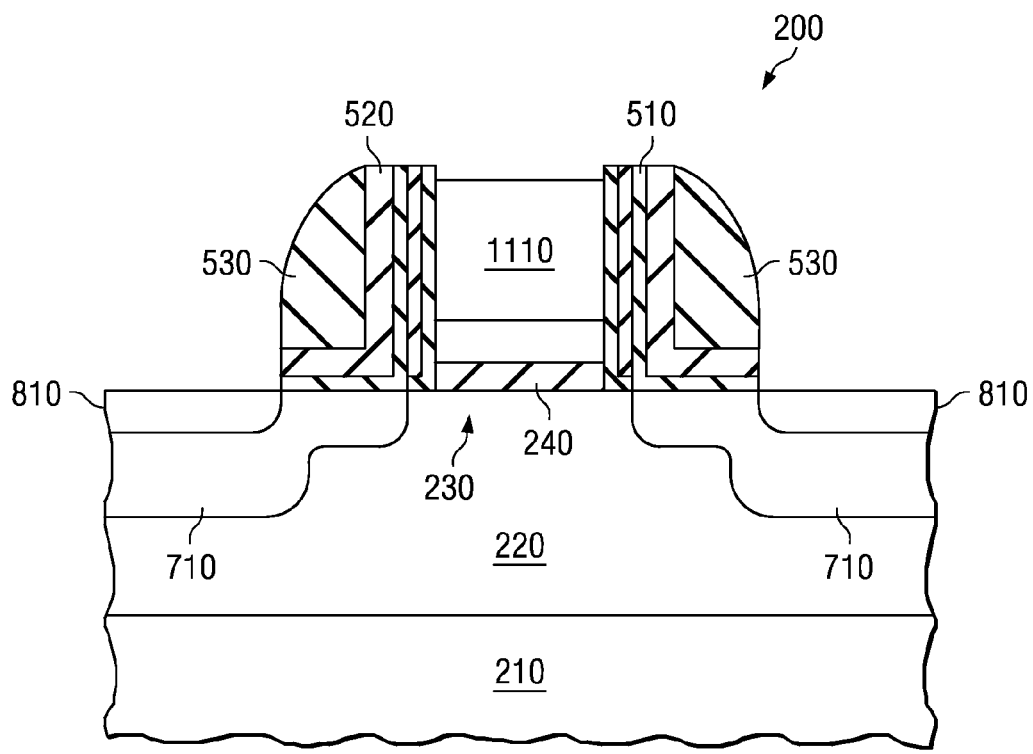

FIG. 11 illustrates the device 200 of FIG. 10 after subjecting the gate electrode 250 and metal 1010 to a silicidation process, thus forming a silicided gate electrode 1110. The resulting silicided gate electrode 1110, in the example embodiment shown, is not fully silicided. However, other embodiments may exist wherein it is fully silicided. Therefore, in the embodiment of FIG. 11, unreacted polysilicon remains therein. The portion of the silicided gate electrode 1110 that has reacted, in this embodiment, comprises mainly $Ni_2Si$. If the metal 1010 were to comprise a different material, the silicided gate electrode 1110 would comprise different elements. The silicided gate electrode 1110, as expected, may include the transient stress dopant, boron in this embodiment.

Those skilled in the art understand the silicidation process, including subjecting the gate electrode 250 and metal layer 1010 to another anneal (e.g., a third RTA in this embodiment). This third RTA is designed to convert the gate electrode 250 to the silicided gate electrode 1110. Advantageous to the disclosure, the inclusion of the transient stress dopant into the gate electrode 250 prior to conducting this third RTA, reduces (if not eliminates) the transient formation of $Ni_{31}Si_{12}$, and thus reduces (if not eliminates) the aforementioned transient stress.

The third RTA temperature typically depends on the metal being used. For example, when nickel is used it is believed that the third RTA may be conducted at a temperature ranging from about 350° C. to about 550° C. and a time period ranging from about 10 second to about 100 seconds. It should be noted that other temperatures, times, and processes could be used if another metal were used.

After completing the silicided gate electrode 1110, the device 200 may be subjected to a selective removal process. For instance, in one embodiment the device 200 could be subjected to an etch recipe consisting of sulfuric acid ($H_2SO_4$), hydrogen peroxide ($H_2O_2$) and water ($H_2O$). This specific etch recipe has a high degree of selectivity and could easily remove any remaining portions of the metal 1010 without harming the silicided gate electrode 1110.

Figure 12:
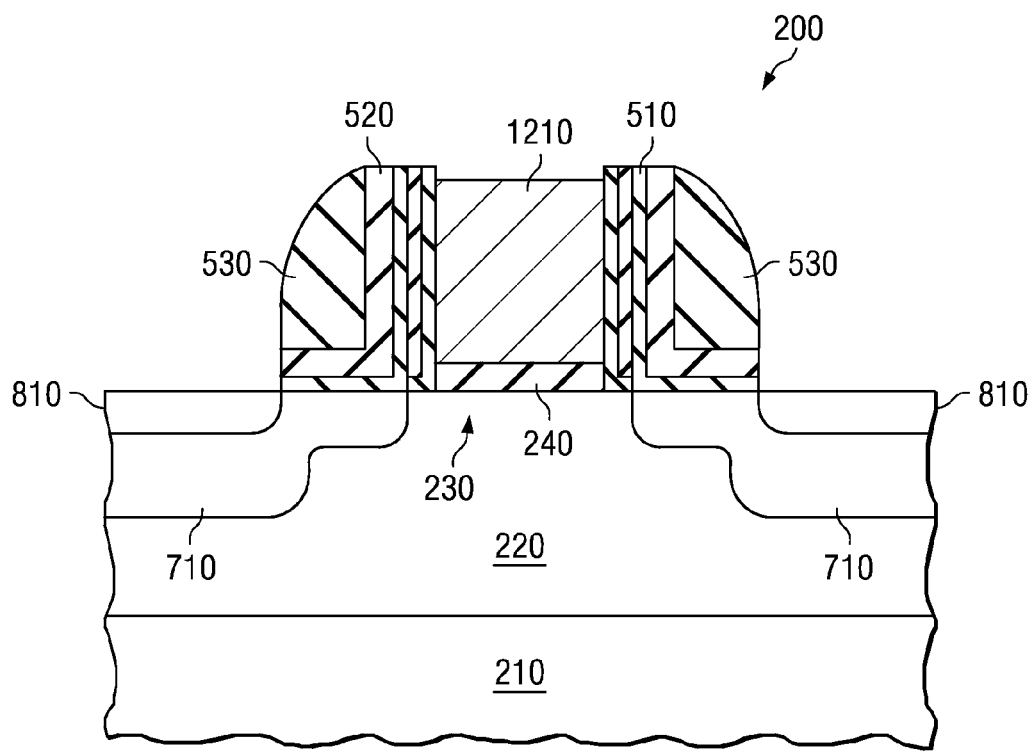

FIG. 12 illustrates the device 200 of FIG. 11 after subjecting the silicided gate electrode 1110 to an additional anneal (e.g., a fourth RTA in this embodiment) to form a fully silicided gate electrode 1210. The fully silicided gate electrode 1210 comprises a different phase of the metal silicide than the silicided gate electrode 1110. For example, the silicided gate electrode 1210, as opposed to the silicided gate electrode 1110, comprises mostly NiSi. Again, if the metal 1010 were to comprise a different material, the silicided gate electrode 1210 would comprise different elements. The silicided gate electrode 1210, as expected, also includes the transient stress dopant, boron in this embodiment.

Those skilled in the art understand this fourth RTA process. Nevertheless, in one embodiment this fourth RTA may be conducted at a higher temperature, for example one ranging from about 400° C. to about 650° C. Moreover, this fourth RTA might be conducted for a time period ranging from about 10 second to about 100 seconds. It should be noted that other temperatures, times, and processes could be used. After completing the fourth RTA, the manufacture of the device 200 would typically continue in a conventional manner, optimally resulting in a device similar to the semiconductor device 100 illustrated in FIG. 1.

It should be noted that the method for manufacturing a semiconductor device as illustrated in FIGS. 2-12 represents only one embodiment of the present disclosure. In one embodiment the exact order of the steps illustrated with respect to FIGS. 2-12 might change depending on the process flow. In another embodiment various other steps could be added to the description of FIGS. 2-12.

Other more significant modifications to the process of FIGS. 2-12 also exist. For instance, other embodiments exist where the silicided source/drain regions 810 are not formed until after siliciding the gate electrode 250 to form the silicided gate electrodes 1110, 1210. In this instance, both the silicided source/drain regions 810 and the silicided gate electrodes 1110, 1210 might use nickel rather than a combination of cobalt and nickel. Nevertheless, those skilled in the art understand the steps that could be used to accomplish this, as well as the steps used to accomplish other variations of that which is currently claimed.

Figure 13:
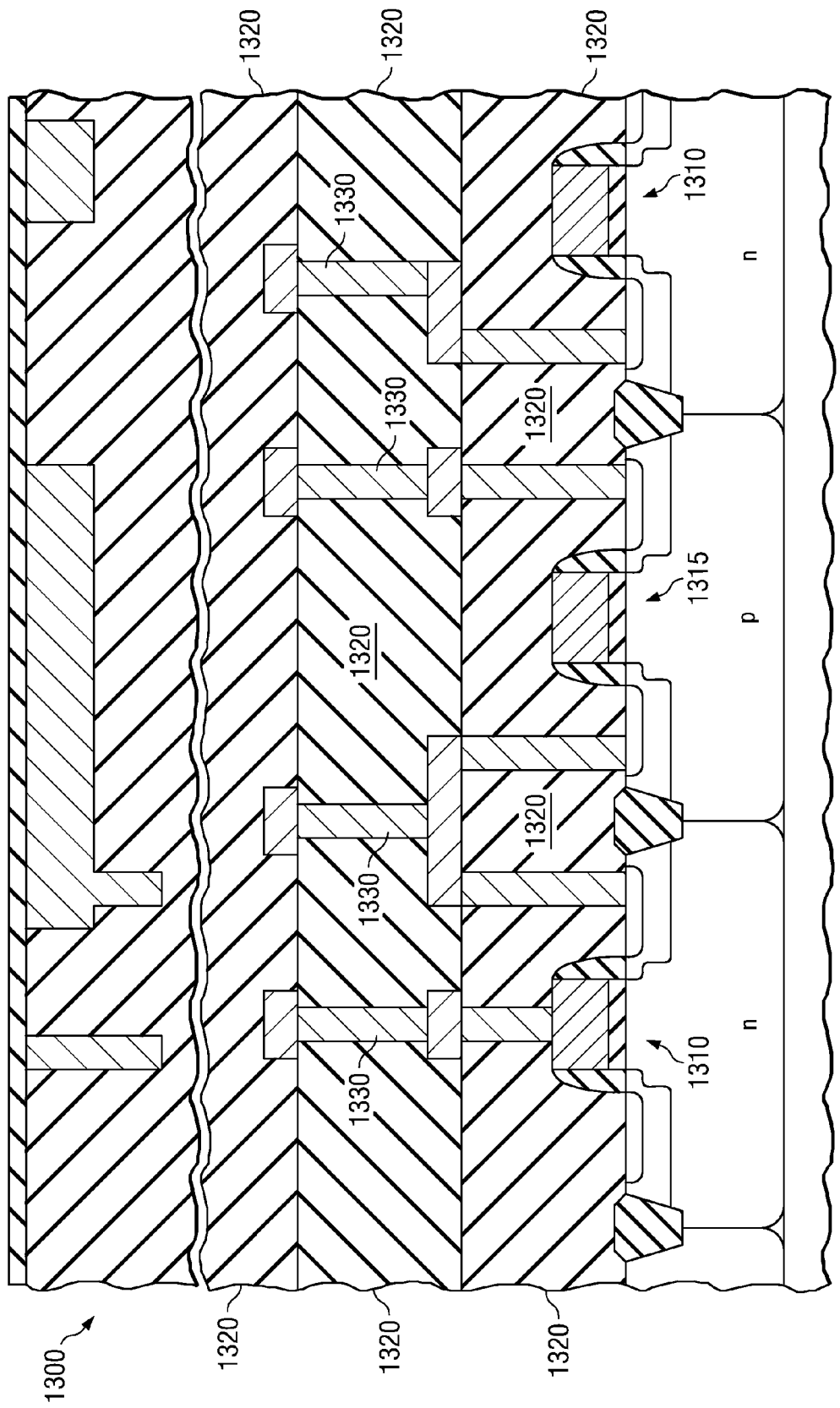
FIG. 13 illustrates an integrated circuit (IC) having been manufactured using one embodiment of the disclosure.

FIG. 13 illustrates an integrated circuit (IC) 1300 having been manufactured using one embodiment of the disclosure. The IC 1300 may include devices, such as transistors used to form CMOS devices, BiCMOS devices, Bipolar devices, as well as capacitors or other types of devices. The IC 1300 may further include passive devices, such as inductors or resistors, or it may also include optical devices or optoelectronic devices. Those skilled in the art are familiar with these various types of devices and their manufacture. In the particular embodiment illustrated in FIG. 13, the IC 1300 includes NMOS devices 1310 and PMOS devices 1315. For instance, in one embodiment the NMOS devices 1310 and PMOS devices 1315 illustrated in FIG. 13 are manufactured using similar processes as described above with respect to FIGS. 2-12, and thus may both contain the transient stress dopant (e.g., a p-type dopant such as boron). Located over the devices 1310, 1315 are interlevel dielectric layers 1320. Located within the interlevel dielectric layers 1320 and contacting the devices 1310, 1315 are interconnects 1330. The resulting IC 1300 is optimally configured as an operational integrated circuit.

Those skilled in the art to which the present disclosure relates will appreciate that other and further additions, deletions, substitutions and modifications may be made to the described embodiments without departing from the disclosure's scope.

What is claimed is:

1. A method for manufacturing a semiconductor device, comprising:
    forming a layer of gate electrode material over a layer of gate dielectric material, wherein the layer of gate dielectric material is positioned over a substrate;
    patterning the layer of gate electrode material and the layer of gate dielectric material to form an NMOS gate structure, wherein the NMOS gate structure includes an NMOS gate dielectric and an NMOS gate electrode;
    forming n-type source/drain regions within the substrate proximate the NMOS gate structure;
    fully siliciding the NMOS gate electrode to form a silicided gate electrode; and
    placing a p-type dopant such that the p-type dopant is present within the NMOS gate electrode prior to or concurrently with the siliciding, wherein placing the p-type dopant includes siliciding the NMOS gate electrode using a layer of metal including the p-type dopant.

2. The method of claim 1 wherein the silicided gate electrode includes the p-type dopant.

3. The method of claim 1 wherein the p-type dopant is boron.

4. The method of claim 1 wherein siliciding the NMOS gate electrode includes siliciding the NMOS gate electrode using nickel.

5. A method for manufacturing a semiconductor device, comprising:
    forming a layer of gate electrode material over a layer of gate dielectric material, wherein the layer of gate dielectric material is positioned over a substrate;
    patterning the layer of gate electrode material and the layer of gate dielectric material to form an NMOS gate structure, wherein the NMOS gate structure includes an NMOS gate dielectric and an NMOS gate electrode;

forming n-type source/drain regions within the substrate proximate the NMOS gate structure;

fully siliciding the NMOS gate electrode to form a silicided gate electrode; and placing a p-type dopant such that the p-type dopant is present within the NMOS gate electrode prior to or concurrently with the siliciding, wherein siliciding includes forming a layer of metal over the NMOS gate electrode and subjecting the layer of metal and the NMOS gate electrode to an anneal, and further wherein placing the p-type dopant includes implanting the p-type dopant into the NMOS gate electrode through the layer of metal prior to the anneal.

6. A method for manufacturing a semiconductor device, comprising:

forming a layer of gate electrode material over a layer of high-k gate dielectric material, wherein the layer of high-k gate dielectric material is positioned over a substrate;

patterning the layer of gate electrode material and the layer of gate dielectric material to form a gate structure, wherein the gate structure includes a gate dielectric and a gate electrode;

forming source/drain regions within the substrate proximate the gate structure;

fully siliciding the gate electrode to form a silicided gate electrode; and placing a p-type dopant within the layer of gate electrode material or the gate electrode after forming the source/drain regions and prior to or concurrently with the siliciding, wherein placing the p-type dopant includes siliciding the gate electrode using a layer of metal including the p-type dopant.

7. A method for manufacturing a semiconductor device, comprising:

forming a layer of gate electrode material over a layer of high-k gate dielectric material, wherein the layer of high-k gate dielectric material is positioned over a substrate;

patterning the layer of gate electrode material and the layer of gate dielectric material to form a gate structure, wherein the gate structure includes a gate dielectric and a gate electrode;

forming source/drain regions within the substrate proximate the gate structure;

fully siliciding the gate electrode to form a silicided gate electrode; and placing a p-type dopant within the layer of gate electrode material or the gate electrode after forming the source/drain regions and prior to or concurrently with the siliciding, wherein siliciding includes forming a layer of metal over the gate electrode and subjecting the layer of metal and the gate electrode to an anneal, and further wherein placing the p-type dopant includes implanting the p-type dopant into the gate electrode through the layer of metal prior to the anneal.

* * * * *